United States Patent
Lee et al.

(10) Patent No.: US 6,864,572 B2
(45) Date of Patent: Mar. 8, 2005

(54) BASE FOR HEAT SINK

(75) Inventors: Cheng Chi Lee, Taipei (TW); Xue Jin Fu, Shenzhen (CN); Zheng Liang Liu, Shenzhen (CN); Wen Qiu Deng, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 398 days.

(21) Appl. No.: 09/938,892

(22) Filed: Aug. 24, 2001

(65) Prior Publication Data

US 2003/0037433 A1 Feb. 27, 2003

(51) Int. Cl.$^7$ .............................................. H01L 23/34
(52) U.S. Cl. ...................... 257/717; 257/706; 257/718; 257/719; 257/727; 29/890.03; 29/890.035; 29/890.038; 29/890.04; 29/890.045; 29/832; 29/836; 29/837; 29/838; 29/739; 29/740; 29/741
(58) Field of Search ...................... 29/890.03, 890.035, 29/890.038, 890.04, 890.045–890.05, 832, 739, 740, 836, 837, 838, 741; 257/706, 684, 718, 719, 727, 717

(56) References Cited

U.S. PATENT DOCUMENTS 5,313,099 A * 5/1994 Tata et al. .................. 257/717

* cited by examiner

*Primary Examiner*—Richard Chang
(74) *Attorney, Agent, or Firm*—Wei Te Chung

(57) ABSTRACT

A heat sink base (10) includes a rectangular body (11) made of aluminum and a circular core (12) made of copper. The body defines a circular through opening (111). A diameter of the opening is slightly less than a diameter of the core. The core is attached within the body according to the following steps: a) pressing the core into the through opening of the body; b) stamping the core to cause it to plastically deform in radial directions and thereby become firmly combined with the body; and c) removing any burring of the core flowing out from the opening such that surfaces of the core and the body are coplanarly smooth.

3 Claims, 3 Drawing Sheets

BASE FOR HEAT SINK

BACKGROUND OF THE INVENTION

1. Field of the Invention

The present invention relates to bases for heat sinks, and particularly to bases consisting of two different metals for improving heat conductivity.

2. Prior Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction.

A conventional heat sink comprises a base and a plurality of fins extending upwardly from the base. A central portion of the base is secured in contact with an electronic device, to conduct heat from the device to a top surface of the base. The heat is then conducted to the fins and dissipated by the fins. The base is often integrally made of aluminum or aluminum alloy. Aluminum and aluminum alloy have relatively low coefficients of heat conduction. Thus the heat generated by the device is not effectively transferred to the top surface of the base.

Improvements on such bases have been developed. FIGS. 4 and 5 show an improved base 2. The base 2 comprises a body 3 made of aluminum, and a plate 4 made of copper. The body 3 defines a recess 5 in a bottom surface thereof. The plate 4 is fixed within the recess 5 by means of welding with an intermediate layer of tin 6. The plate 4 contacts an electronic device to transfer heat from the device to the body 3. Unfortunately, the coefficient of heat conduction of tin (67 w/cm. k) is much lower than that of copper (359 w/cm. k) and that of aluminum (207 w/cm. k). Thus the layer of tin 6 between the plate 4 and the body 3 retards heat conduction between the plate 4 and the body 3, thereby reducing the efficiency of heat dissipation.

SUMMARY OF THE INVENTION

Accordingly, an object of the present invention is to provide a heat sink base having a highly heat-conductive core directly connected within the base to thereby facilitate heat conduction.

To achieve the above-mentioned object, a heat sink base in accordance with the present invention comprises a rectangular body made of aluminum and a circular core made of copper. The body defines a circular through opening in a central portion thereof. A diameter of the opening is slightly less than a diameter of the core. The core is attached within the body according to the following steps: a) pressing the core into the through opening of the body; b) stamping the core to cause it to plastically deform in radial directions and thereby become firmly combined with the body; and c) removing any burring of the core flowing out from the opening such that surfaces of the core and the body are coplanarly smooth.

Other objects, advantages and novel features of the present invention will be drawn from the following detailed embodiment of the present invention with attached drawings, in which:

DESCRIPTION OF THE PREFERRED EMBODIMENT

Figure 1:
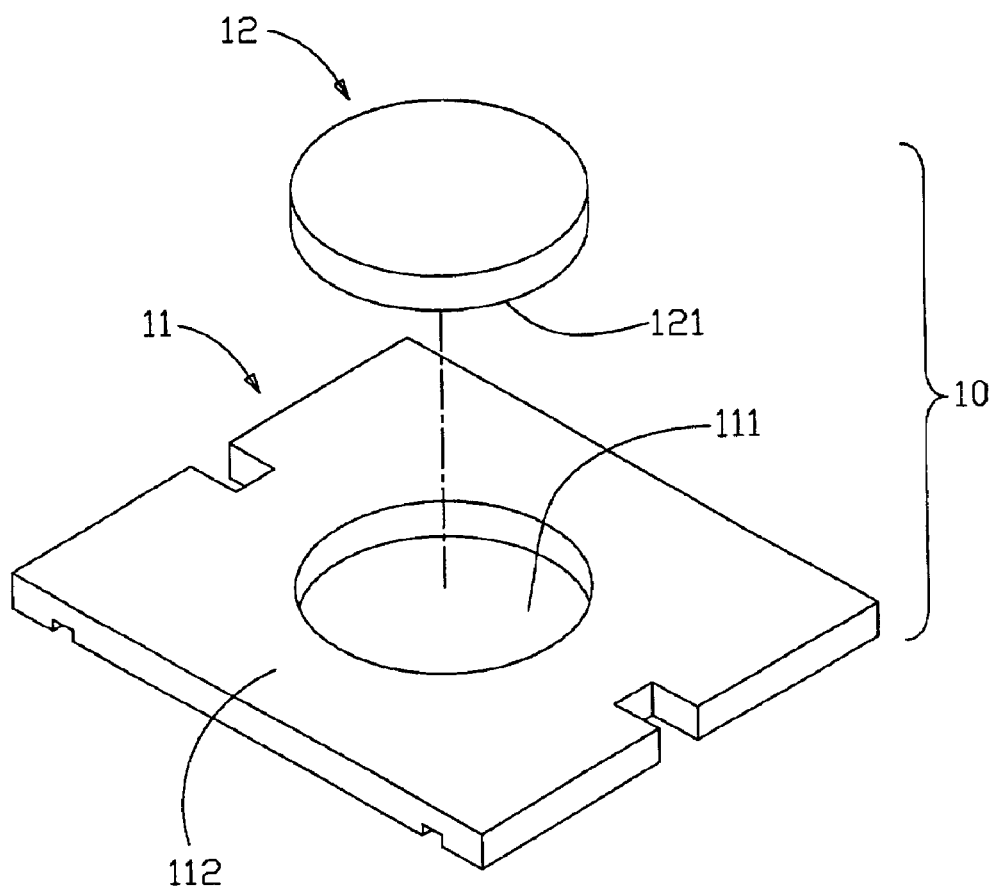
FIG. 1 is an exploded view of a heat sink base in accordance with the present invention.

Referring to the attached drawings, FIG. 1 is an exploded view of a base 10 constructed in accordance with the present invention. The base 10 comprises a rectangular body 11 and a circular core 12.

The body 11 is made of good heat conductive metallic material, such as aluminum. The body 11 comprises a top surface 112 and a bottom surface (not labeled) opposite to the top surface 112. A circular through opening 111 is defined in a central portion of the body 11.

The core 12 is made of material having heat conductivity higher than that of the body 11, such as copper. The core 12 comprises a bottom surface 121. A diameter of the core 12 is slightly larger than a diameter of the opening 111.

Figure 2:
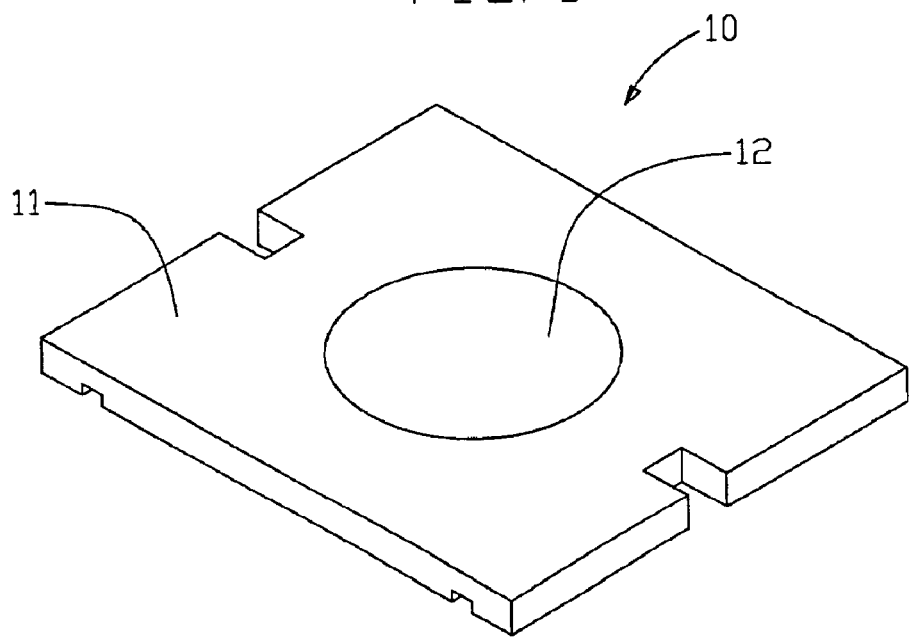
FIG. 2 is an assembled view of FIG. 1.

Referring also to FIG. 2, the core 12 is attached within the body 11 as follows: a) the core 12 is pressed into the opening 111 of the body 11; b) the core 12 is stamped to cause it to plastically deform outwardly in radial directions and thereby become firmly combined with the body 11; and c) any burring of the core 12 flowing out from the opening 111 is removed such that a top surface of the core 12 and the top surface 112 of the body 11 are coplanarly smooth, and the bottom surface 121 of the core 12 and a bottom surface of the body 11 are coplanarly smooth.

Figure 3:
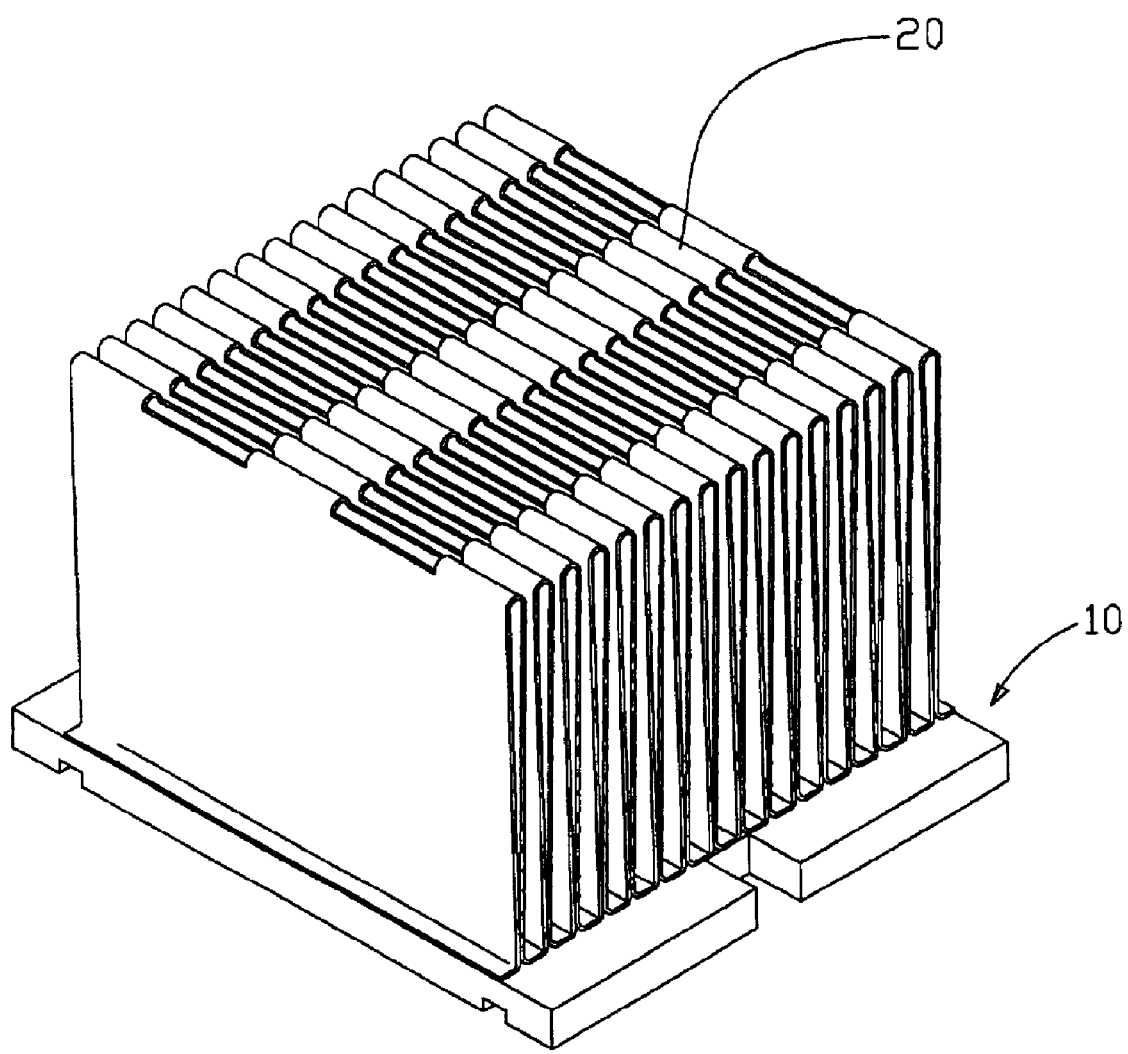
FIG. 3 is a view of the base of FIG. 2 having a plurality of folded fins attached thereto.
Figure 4:
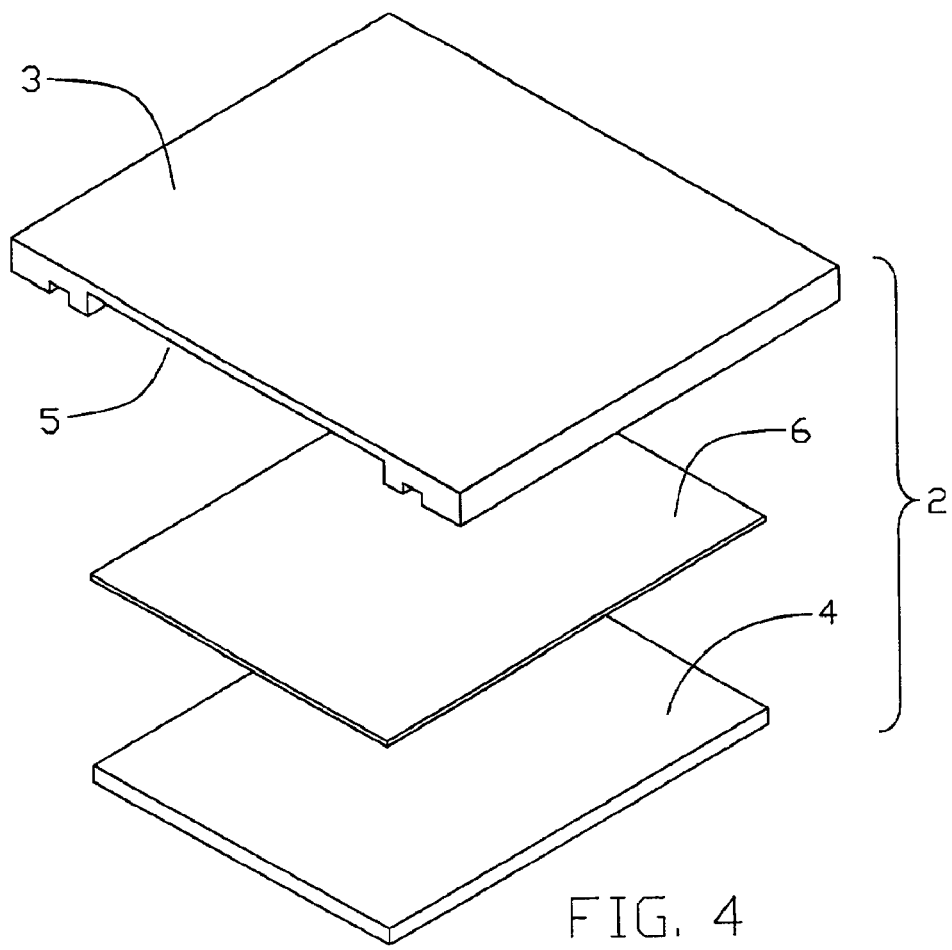
FIG. 4 is an exploded view of a conventional base.
Figure 5:
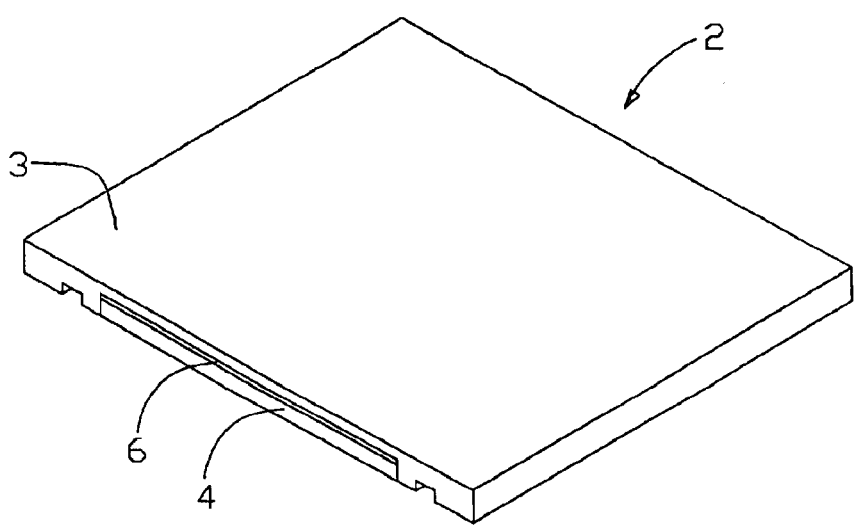
FIG. 5 is an assembled view of FIG. 4.

Referring also to FIG. 3, a plurality of folded fins 20 is then attached to the top surface 112 of the body 11 of the base 10 by conventional means.

In the present invention, the core 12 is in direct contact with the body 11 and the folded fins 20. An intermediate layer of connecting metal is not needed between the core 12 and the body 11. Relatively high heat resistance of a connecting metal such as tin is eliminated, thereby improving efficiency of heat conduction throughout the base 10. When the bottom surface 121 of the core 12 is in contact with an electronic device (not shown), heat generated by the electronic device is absorbed by the core 12 and then rapidly conducted to the body 11 and the fins 20. The heat is subsequently dissipated by the fins 20.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat sink comprising a base (10) including a body (11) defining a through opening (111) in a center portion, and a core (12) being plastically deformed to be snugly and tightly retainably received in the opening (111), said core providing a bottom face (121) adapted to be engaged with a heat-generating device, a plurality of heat dissipation fins (20) attached to a top face of the base, wherein said body (11) is made of a first material having a first conductivity thereof and said core (12) is made of a second material having thereof a second conductivity superior to said first conductivity.

2. The heat sink as claimed in claim 1, wherein the core is plastically deformed outwardly in the opening to thereby firmly combine with the body.

3. The heat sink as claimed in claim 2, wherein the core has a diameter slightly larger than a diameter of the opening before the core is received in the opening.

* * * * *